US00RE37777E

(19) United States
(12) Reissued Patent
Herman et al.

(10) Patent Number: US RE37,777 E
(45) Date of Reissued Patent: Jul. 2, 2002

(54) SWITCH APPARATUS REQUIRING THE HAND OF THE OPERATOR TO ACTIVATE THE SWITCH BY BREAKING A LIGHT BEAM

(76) Inventors: Jeffrey G. Herman, 3891 Stanton Rd., Lake Orion, MI (US) 48362; Mark C. Matzka, 1552 Kings Cove Dr., Rochester Hills, MI (US) 48306

(21) Appl. No.: 08/994,125

(22) Filed: Dec. 19, 1997

Related U.S. Patent Documents

Reissue of:
(64) Patent No.: 4,939,358
Issued: Jul. 3, 1990
Appl. No.: 07/198,613
Filed: May 23, 1988

U.S. Applications:

(63) Continuation of application No. 08/248,635, filed on May 23, 1994, now abandoned, which is a continuation of application No. 07/897,360, filed on Jun. 11, 1992, now abandoned, which is a continuation of application No. 06/916,525, filed on Oct. 8, 1986, now abandoned.

(51) Int. Cl.[7] ..... G01V 9/04
(52) U.S. Cl. ..... 250/221; 250/229; 361/189
(58) Field of Search ..... 250/221, 229; 361/177, 189; 340/555–557

(56) References Cited

U.S. PATENT DOCUMENTS

| | | | | | |
|---|---|---|---|---|---|
| 2,174,206 | A | | 9/1939 | Etter | 250/221 |
| 2,228,780 | A | | 1/1941 | Roberts | 250/221 |
| RE23,674 | E | | 6/1953 | Spierer | 219/39 |
| 3,207,957 | A | * | 9/1965 | Naylor | 361/189 |
| 3,242,341 | A | * | 3/1966 | Woodward | 250/221 |
| 3,360,654 | A | * | 12/1967 | Muller | 250/221 |
| 3,576,277 | A | | 4/1971 | Blackmon | 250/221 |
| 3,704,396 | A | * | 11/1972 | MacDonald | 317/124 |
| 3,746,863 | A | | 7/1973 | Pronovost | 250/208 |
| 3,805,061 | A | | 4/1974 | De Missimy et al. | 250/221 |
| 3,805,085 | A | | 4/1974 | Andrews | 307/115 |
| 3,842,260 | A | | 10/1974 | Christensen | 250/221 |
| 3,895,269 | A | * | 7/1975 | Geremia | 361/189 |
| 3,914,621 | A | | 10/1975 | Passarelli, Jr. | 307/113 |
| 4,015,122 | A | * | 3/1977 | Rubenstein | 250/221 |
| 4,074,602 | A | * | 2/1978 | Bower | 361/189 |
| 4,185,192 | A | * | 1/1980 | Wagner | 250/221 |
| 4,227,547 | A | * | 10/1980 | Cameron | 137/554 |
| 4,239,961 | A | * | 12/1980 | Lasar | 250/221 |

(List continued on next page.)

FOREIGN PATENT DOCUMENTS

| | | |
|---|---|---|
| JP | 6336182 | 2/1988 |

*Primary Examiner*—Stephone B. Allen
(74) *Attorney, Agent, or Firm*—Gifford, Krass, Groh, Sprinkle, Anderson & Citkowski, P.C.

(57) ABSTRACT

A manually operable switch apparatus for a machine having at least one mode of operation actuated by a control circuit includes a spaced pair of switches which are simultaneously manually operable without the application of exertive contact by an operator. Preferably, each switch includes an infrared emitter spaced from an infrared receiver, and a single or double pole, double throw relay actuated when the beam between the emitter and receivers are broken, so as to cause actuation of an alternative mode of machine operation. The use of switches which do not require exertive contact obviates the injury to wrist and finger tendons experienced by machine operators when conventional palm buttons are employed on machines requiring repetitive operator manipulations. The use of a spaced pair of such switches requires that the operator place both hands on the switches in order to operate the machine, so that the operator cannot inadvertently place a hand in or adjacent to the machine during operation, thus serving to prevent injury to the worker. Such a switch apparatus is substantially more reliable then conventional mechanical and pneumatic switches, subject to significantly less breakdown in use.

11 Claims, 2 Drawing Sheets

U.S. PATENT DOCUMENTS 4,249,074 A * 2/1981 Zettler et al. ..... 250/221
4,358,651 A * 11/1982 Hostetler et al. ..... 200/334
4,388,528 A * 6/1983 Walter ..... 250/221
4,412,268 A 10/1983 Dassow ..... 361/181
4,479,053 A * 10/1984 Johnston ..... 250/221
4,520,262 A * 5/1985 Denton ..... 250/221
4,563,578 A * 1/1986 Nagai ..... 250/221
5,077,467 A 12/1991 Barron, Jr. et al. ..... 250/221
5,168,173 A 12/1992 Windsor ..... 307/139

* cited by examiner

SWITCH APPARATUS REQUIRING THE HAND OF THE OPERATOR TO ACTIVATE THE SWITCH BY BREAKING A LIGHT BEAM

Matter enclosed in heavy brackets [ ] appears in the original patent but forms no part of this reissue specification; matter printed in italics indicates the additions made by reissue.

This is a continuation of *Ser. No. 248,635, filed May 23, 1994, abandoned which is a continuation of reissue application Ser. No. 897,360, filed Jun. 11, 1992 abandoned for Ser. No. 07/198,613 filed May 23, 1988, now U.S. Pat. No. 4,939,358, issued Jul. 3, 1990, which was a continuation of* co-pending application Ser. No. 916,525, filed on Oct. 8, 1986, now abandoned.

BACKGROUND OF THE INVENTION

1. Field of the Invention

The present invention relates to machine controls, and more particularly to a switch assembly for initiating or changing a mode of operation of a machine.

2. Description of the Prior Art

It has long been known to use a spaced pair of manually operable switches (often of the type known as palm buttons) to activate the operational modes of machines such as stamping presses, riveters, tube benders, spot welders or the like. The purpose of the spaced pair of manually operable switches is to ensure that both hands of the worker are positioned away from the machine prior to operation. For this purpose of safety, the switches of such a machine must be operated simultaneously and must be spaced sufficiently far apart or otherwise suitably obstructed to prevent simultaneous actuation of the switches with a single hand. The Federal Occupational Safety and Health Administration, of course, sets the criteria which must be met by such machine operating equipment, to ensure adequate worker safety.

A schematic of a conventional control circuit for such machines is shown in FIG. 4. The circuit includes a pair of palm buttons 110 which each include a spaced pair of electrical contacts 112 and 114. One contact 112 is disposed in a first limb 116 of a parallel machine operating circuit 118, while the other contact 114 is disposed in a second limb 120 of the operating circuit 118. The circuit 118 includes control means 122 for instituting alternative operative modes of a machine 10, as well as anti-tiedown logic circuitry, as described below. The connection between the machine 10 and logic and control circuitry 122 is shown only schematically in FIG. 4, since this connection is well known in the art. For example, the control means 122 can first direct the machine to load a part and then direct the machine to operate on the part (not shown).

The palm buttons 110 are spring-biased or pneumatically biased, so that in the absence of the application of an exertive contact by the operator, the contacts 112 complete the limb 116 and cause the control and logic circuitry means 122 to operate the machine 10 in its first mode of operation. When the operator applies exertive contact to the palm buttons 110, the contacts 112 are moved out of connection to the limb 116, and the contacts 114 are subsequently moved into connection to the limb 120. This causes the control means 122 to operate the machine 10 in its second mode of operation.

It is undesirable to use simple single throw switches to replace the palm buttons 110 because this can obviate the protection given to the worker when the second switch is employed. If one switch is left in an operative position while the other switch can be operated by a single hand of a worker, the worker's free hand can become entangled with operative portions of the machine, sometimes resulting in potentially fatal injury. Indeed, it is for this reason that OSHA regulations generally require that existing machines already incorporate anti-tiedown logic circuitry that is, a control to define and limit the intervals of and between activation of the spaced switches so that, in order for actuation to be considered substantially simultaneous (and thereby permit machine operation), the switches typically must both be actuated each time machine operation is desired, and both also actuated within one second of each other. In a known manner this circuitry thus prevents machine operation if one switch is attempted to be continuously actuated, by being tied down. This conventional anti-tiedown logic circuitry and machine control means is not by itself part of the present invention.

While the use of a spaced pair of palm buttons has been adequate for the intended purpose of safety, such buttons are subject to the drawback that the worker must apply significant exertive contact to the palm buttons, in order to achieve actuation of them. A substantial number of machine operators are now recognized as being subject to fatigue from the repetitive application of exertive contact against conventional palm buttons. Indeed, operators are increasingly experiencing inflammation of the tendons, due to this repetitive and forceful action of the fingers and wrists. This inflammation of the tendons of the fingers and wrists is known as Carpal Tunnel Syndrome. The ailment has increased worker fatigue and complaints, has decreased productivity and has increased the frequency of disability claims under the workmen's compensation laws and programs. These effects are injurious to the worker and substantially increase the costs associated with operations of the machine in question.

Additionally, palm buttons and like devices are subject to unacceptably great wear and breakage, due in part to the frictional movement of the members making them up, for example, such as the shaft and bore of a conventional palm button. Additionally, contacts such as the button contacts 112 and 114 described above are subject to bending upon repeated mechanical manipulation and impactment against the circuit contact which they abut.

SUMMARY OF THE PRESENT INVENTION

The present invention overcomes these and other drawbacks by providing a machine control which does not require application of exertive contact to the switches incorporated in the machine control. More particularly, the present invention comprises a manually operable switch apparatus useful on machinery having at least one and preferably two disparate modes of operation actuated by energization of a means for controlling each mode of operation. The apparatus comprises a pair of actuation switches which are simultaneously manually operable without the application of exertive contact thereagainst, in contrast to the palm buttons and other switches of the prior art. The actuation switches complete parallel circuits connected to conventional machine control and anti-tiedown circuit means, and are sufficiently spaced apart or otherwise obstructed in a known manner so as to obviate simultaneous operation by a single hand of an operator, as ordinarily required by the relevant safety laws and regulations. Indeed, the optimal utilization of the present invention lies in simply [replaceing] *replacing* the existing switches on a machine having such safety controls, with the exertive-contact free switches of the invention.

While each of the actuation switches can comprise a proximity switch, in the preferred embodiment of the present invention the actuation switches each comprise an infrared emitter, paired with an infrared receiver spaced from the emitter a sufficient distance to permit introduction of one or more fingers of the user between them. The switches also preferably comprise a single or double pole, double throw relay having one throw operatively connected to the control and [anti-tiedoen] *anti-tiedown* means for each mode of machine operation. The relay is actuated by a solenoid operatively connected to an output of the infrared emitter and receiver.

When the infrared beams of the switches are broken by the fingers of a user, each paired emitter and receiver close a circuit containing the associated solenoid, and energize the control means and anti-tiedown circuitry so as to operate the machine in one mode or another. The simultaneous breaking of the infrared beams of the two spaced switches, when controlled by the anti-tiedown circuit and control means, thus allows actuation of alternative modes of machine operation without requiring the machine operator to apply exertive contact against any switches or other objects, thus avoiding the mechanical breakdown associated with such switches, and the attendant physical effects upon the wrist and finger tendons of the operator.

BRIEF DESCRIPTION OF THE DRAWING

A better understanding of the present invention will now be had upon reference to the following detailed description, when read in conjunction with the accompanying drawing, wherein like reference characters refer to like parts throughout the several views, and in which.

DETAILED DESCRIPTION OF THE PREFERRED EMBODIMENT OF THE PRESENT INVENTION

Figure 1:
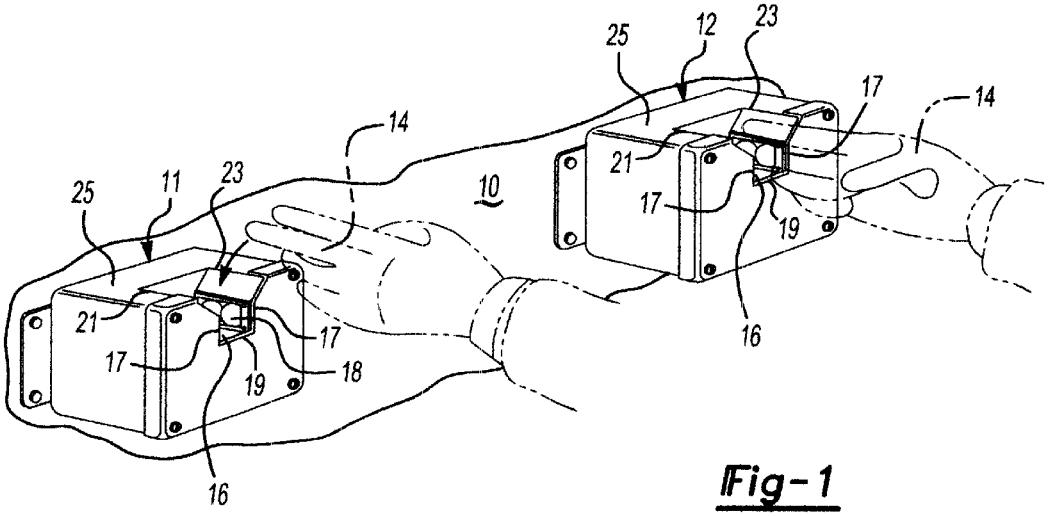
FIG. 1 is a perspective view of the preferred embodiment of the present invention.

With reference first to FIG. 1, the manually operable switch apparatus of the present invention is thereshown positioned on the front of a machine 10 and first comprises a pair of actuation switches 11 and 12. The actuation switches 11 and 12 are characterized by being manually operable without the application of exertive contact against them. For example, the switches 11 and 12 are operable by the insertion of the fingers 14 of a machine operator into a slot 16 formed in each of the actuation switches 11 and 12. *Slot 16 is preferably provided to act as a guide to the operator's hand. Specifically, slot 16 is formed by sides 17 spaced apart and extending vertically upward from a bottom 19 to form a generally U-shaped opening. Upper edges 21, 23 extend inwardly from the top 25 of the switch 11, 12 toward the bottom 19 of the slot 16.* An infrared beam is disposed across the slot 16, such that a mode of operation of the machine 10 is actuated when the beams of both switches 11 and 12 are simultaneously broken by the operator's fingers 14. *The profile of slot 16 guides the operator's fingers to break the beam, thereby activating the machine, in a manner that avoids physical effects upon the wrist and finger tendons of the operator.*

Figure 2:
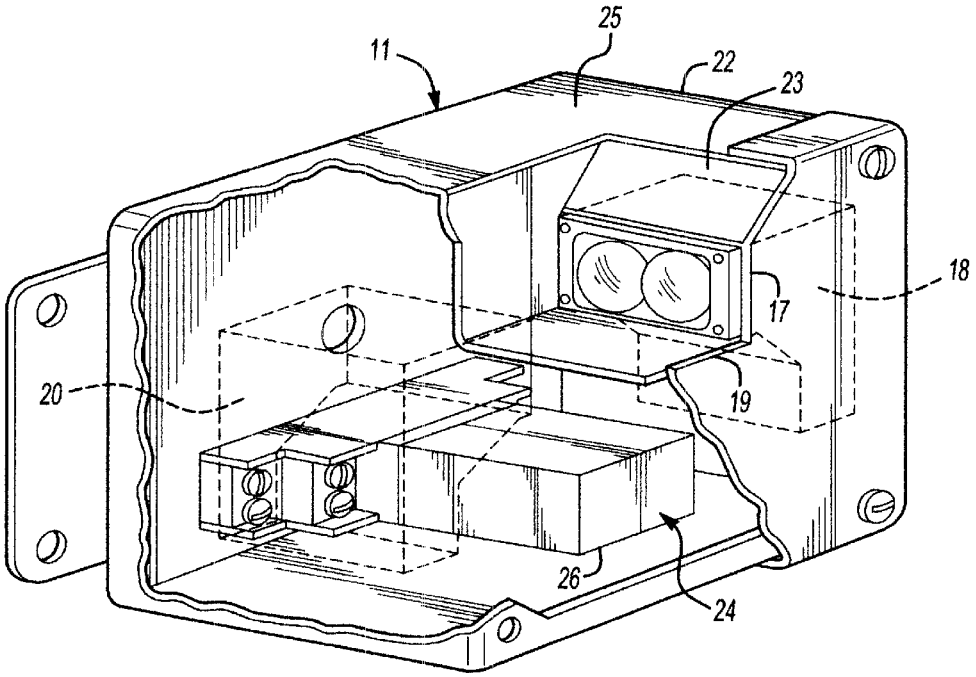
FIG. 2 is a partial perspective view of the preferred embodiment of the present invention with parts removed for clarity.

The actuation switches 11 and 12 can comprise proximity switches. However, switches 11 and 12 each preferably comprise an infrared emitter 18, and an infrared receiver 20 spaced from the emitter 18 a sufficient distance to permit the introduction of the operator's fingers 14 therebetween. As shown in FIGS. 1 and 2, the emitter 18 and receiver 20 are each disposed in a switch housing 22 (for example, that of switch 11) and are operatively connected to a power supply (not shown) and to a relay 24. The relay 24 is actuated upon breaking of the infrared beam between the emitter 18 and the receiver 20 by the operator's fingers 14. The relay can comprise a simple series relay or other relay; however, in the preferred embodiment of the present invention, the machine 10 possesses at least two distinct modes of operation, so that the relay 24 preferably comprises at least a single pole, double throw, break-make solenoid actuated relay 26. For example, an emitter and receiver pair such as model SMA81E and SMA81R, respectively, manufactured by Banner Engineering Corp., Minneapolis, Minnesota are useful in the present invention, as is an Omron LY 2-US 120V AC relay. This last relay is, in fact, a double pole relay; the second pole and associated throws are not operatively employed in the disclosed embodiment of the present invention, and thus are not further described. Additional poles and throws may, of course, be useful with the particular machine on which the switches are employed.

Figure 3:
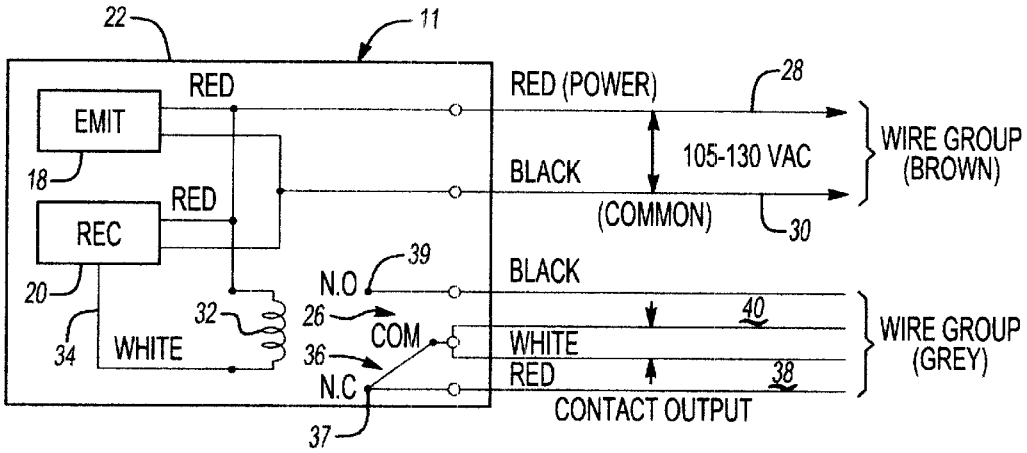
FIG. 3 is a plan of a portion of the circuitry of the preferred embodiment of the present invention.

More particularly, as shown in FIG. 3, the infrared emitter 18 and receiver 20 of one of the switches, for example, the switch 11, are connected to the machine power supply or other power supply by hot and common leads 28 and 30, respectively. The hot lead 28 is also connected to solenoid coil 32 of the relay 26. A receiver output line 34 is also connected to the coil 32. The emitter 18 and receiver 20 open an energized circuit from the hot lead 28, through the coil 32 to the common lead 30 only when the infrared beams between the emitter 18 and the receiver 20 is broken by the operator's fingers 14.

The relay 26 includes a relay contact 36 movable between a normally closed circuit contact 37 and a normally open circuit contact 39. When the beam is not broken, the relay contact 36 abuts the first circuit contact 37 and closes a first actuation circuit 38 connected to the relay contact 36 and the first circuit contact 37, connected to the control means and logic circuitry 122, and corresponding to one mode of operation of the machine. When the infrared beam is broken by the user's fingers 14, the coil 32 actuates and moves the relay contact 36 into abutment with the second circuit contact 39 so as to close a second actuation circuit 40 connected to the relay contact 36 and the second circuit contact 39, also connected to the control means and logic circuitry 122, and corresponding to a second disparate mode of operation of the machine 10. Thus, breaking of the infrared beam causes the first circuit 38 to be broken and the second circuit 40 to be completed thereafter. The switch 12, of course, is constructed in an identical fashion.

Figure 4:
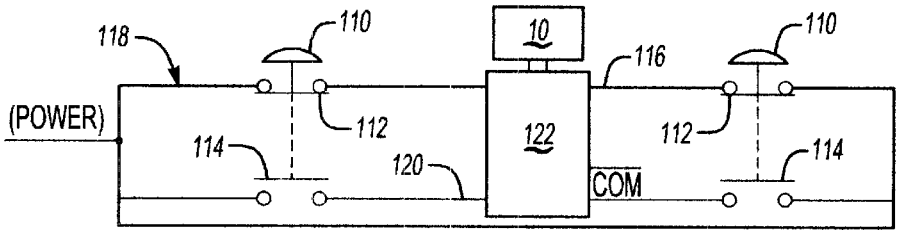
Fig-4 PRIOR ART
FIG. 4 is a plan of the circuitry of prior art devices.
Figure 5:
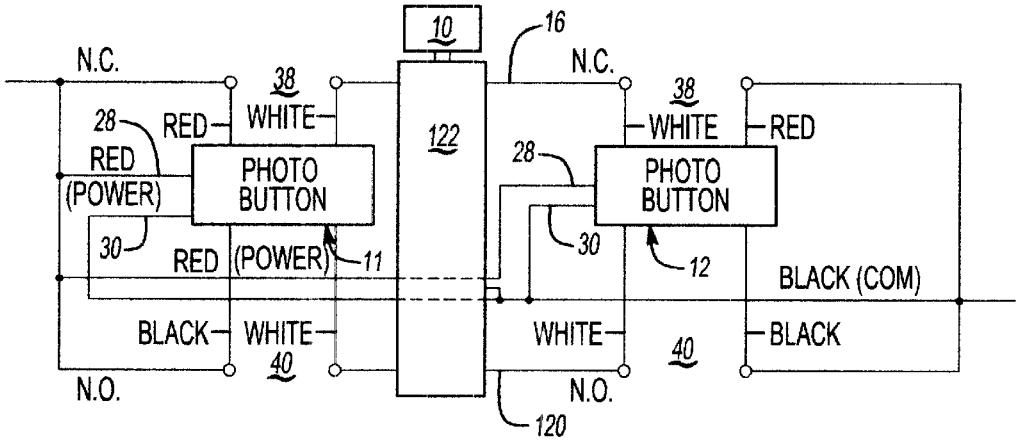
FIG. 5 is a plan of the preferred embodiment of the present invention.

As more clearly shown in FIG. 5, the spaced switches 11 and 12 are preferably connected to a machine having a parallel pair of machine operating mode circuit limbs 116 and 120. As in the prior art, the limbs 116 and 120 are connected to the control means and anti-tiedown logic circuitry 122. The first machine actuation circuit 38 of each switch 11 and 12 is connected to the first limb 116, while the second machine actuation circuit 40 of each switch 11 and 12 is connected to the second limb 120. Most preferably, the switches 11 and 12 are directly substituted for the palm buttons 110 or other switches of an existing machine 10, so that the circuit limbs 116 and 120, and the control means and logic circuitry 122, are identical to those shown in and described in conjunction with FIG. 4. The two switches 11 and 12 are also conveniently connected to the same hot power line 28 and common line 30.

In light of the foregoing description, operation of the switch apparatus according to the present invention can be readily understood. Preferably, when the beams extending between the emitters 18 and receivers 20 of each of the switches 11 and 12 are unbroken, the first circuit 38 and limb 116 are energized, so that the control means and logic circuitry 122 is actuated to bring about operation of the machine 10 in its first mode of operation. When an operator wishes to change the operational mode of the machine 10 to its second mode, the operator inserts the fingers 14 of both hands into the slots 16 of the switches 11 and 12, between the infrared emitters 18 and the receivers 20. *Upper edges 21, 23 are angled inwardly toward sides 17 to guide the operator to activate the switch 11, 12 in a non-exertive position. By creating a slot 16 having a generally U-shaped opening, with sides 17 vertically extending a height equal to or greater than the base length, the operator's fingers 14 are positioned in such a way as to prevent any repetitive physical strain upon the tendon in the wrist and/or fingers of the operator.* When the beams are broken substantially simultaneously, as required by the control means and logic circuitry 122, the coil 32 of each switch 11 and 12 moves the relay contact 36 from its normal contact with the first circuit contact 37 into contact with the second circuit contact 39, so as to first break the first mode circuit 38, deenergizing the limb 116. Each relay contact 36 then contacts the second circuit contact 39, so as to complete or make the second actuation circuit 40, and energize the second limb 120, thereby causing the control means and logic circuitry 122 to operate the machine in its second mode of operation.

The machine 10 is preferably returned to its first mode of operation in any conventional fashion. For example, the machine operating control means and logic circuitry 122 can contain a conventional means for timing the interval of operation of the first and second modes of machine operation. These types of controls of machine operation are well known in the art, and are not further described here. Conventionally, the control means and anti-tiedown logic circuit 122 prevents the continued actuation of one mode or another when the beam of one of the switches 11 and 12 is continuously obstructed, or if the length of time between operation of them is unacceptably long, thus preventing the possibility of bypassing the safety feature of the invention produced by the spacing of the pair of switches 11 and 12. Again, it is most preferred that such circuitry is incorporated in the existing machine whose switches are replaced with those of the present invention. Such safety circuitry is, by itself, not part of the invention, but rather is part of the prior art.

The present invention thus provides a switch apparatus which is substantially more mechanically reliable than are prior art switch apparatus, and which avoids the Carpal Tunnel Syndrome encountered in the repetitive use of conventional machine operating switches such as palm buttons. Advantageously, the switch apparatus of the present invention is useful in conjunction with a parallel pair of machine operating circuits; indeed, preferably, the switches of the present invention are directly connectable to the machine 10 in replacement of the existing palm buttons or other machine switches. In such a case, the first control circuits 38 and 40 of each switch are directly connected to the associated circuit limbs 116 and 120 of the machine from which the existing palm buttons or other switches have been physically detached. Of course, it should be clear that the particular structure of the switches 11 and 12 is a matter of [choise] *choice*, depending upon the environment in which they are to be used. For example, although a relay 24 has been used in the illustrated embodiment of the invention, it should be apparent that there are modifications of the present invention where such a relay would not be necessary.

Having described our invention, however, many modifications thereto will become apparent to those skilled in the art to which it pertains, without deviation from the spirit of the invention, as defined by the scope of the appended claims.

We claim:

[1. For use in conjunction with a machine having a mode of operation in which the machine is actuated to perform a machining operation and a circuit responsive to two input signals, said circuit preventing operation of said machine in said mode unless said circuit receives said input signals substantially simultaneously, a pair of switch assemblies for producing said input signals, each switch assembly comprising:

a housing having a generally U-shaped opening having sides and a bottom, said opening being dimensioned to allow the introduction of a human hand into said opening between said sides and to said bottom, a photo optical switch contained in said housing, said photo optical switch producing an output signal upon the introduction of a human hand into the opening and without contact between the human hand and the photo optical switch and without the necessity of the hand applying an exertive force, means for electrically connecting the output signal from each photo optical switch as an input signal to said circuit to enable operation of said machine in said mode.]

[2. The invention according to claim 1, wherein said photo-optical switches comprise proximity switches.]

[3. The invention according to claim 1, wherein said photo-optical switches each comprise an infrared emitter and an infrared receiver spaced from said emitter.]

[4. The invention according to claim 1, and comprising an anti-tiedown logic circuit to which each of said photo-optical switches are operatively connected.]

[5. The invention according to claim 1, and comprising an actuation circuit having parallel limbs, each of said limbs being associated with disparate operative modes of said apparatus, and wherein said photo-optical switches each comprise an at least single pole, double throw, break-make solenoid actuated relay, operatively connected to said limbs, and means for energizing said relay.]

*6. For use in conjunction with a machine having a mode of operation and a circuit responsive to two input signals, said circuit preventing said mode of operation unless said circuit receives said input signals substantially simultaneously,*

*a pair of switch assemblies for producing said input signals, each switch assembly comprising:*

*a housing having a generally U-shaped opening defined by a pair of substantially vertical side members with opposed facing surfaces extending upwardly from a bottom surface, said opening being of sufficient size to allow the introduction of at least a portion of a human hand thereinto;*

*a photo-optical switch contained in said housing, said switch including a light emitter supported immediately adjacent one of said side surfaces and a light detector supported immediately adjacent the other of said side surfaces, such that the light from said emitter travels directly to said detector along a straight path defining a beam,*

*said photo-optical switch producing an output signal upon the interruption of said beam through the introduction of a human hand into the opening of said housing without contact between said hand and the bottom of said housing, and without the necessity of said hand applying an exertive force; and*

*means for electrically connecting the output signal from said photo-optical switch as an input signal to said circuit to enable operation of said machine in said operational mode.*

*7. The invention according to claim 6, wherein said beam is substantially horizontal.*

*8. The invention according to claim 6, wherein said beam is infrared.*

*9. The invention according to claim 6, further including an anti-tiedown logic circuit operatively connected to each of said photo-optical switches.*

*10. The invention according to claim 6, further including:*

*an actuation circuit having parallel limbs, each of said limbs being associated with a disparate operational mode of said machine; and*

*a double-throw relay operatively interconnecting said photo-optical switches to said limbs.*

*11. The invention according to claim 6, wherein said switch assemblies are sufficiently spaced apart so as to obviate simultaneous operation by a single hand of an operator.*

*12. For use in conjunction with a machine having first and second disparate modes of operation and a circuit responsive to two input signals, said circuit preventing one of said modes of operation unless said circuit receives said input signals substantially simultaneously;*

*a pair of switch assemblies for producing said input signals, each switch assembly comprising a housing having a generally U-shaped opening defined by a pair of substantially vertical side members with opposed facing surfaces extending upwardly from a bottom surface, said opening being of sufficient size to allow the introduction of a portion of a human hand thereinto, and a photo-optical switch contained in said housing, said switch including a light emitter and a light detector supported on either side of said opening so as to establish a light beam thereacross;*

*said photo-optical switch producing an output signal upon the interruption of said beam without contact between said hand portion and the bottom of said housing, and without the necessity of said hand portion applying an exertive force;*

*an actuation circuit having parallel limbs, each of said limbs being associated with one of said disparate operational modes of said machine; and*

*a double-throw relay operatively interconnecting said photo-optical switches to said limbs to enable operation of said machine in only one of said operational modes at any given time.*

*13. The invention according to claim 12, wherein said beam is substantially horizontal.*

*14. The invention according to claim 12, wherein said beam is infrared.*

*15. The invention according to claim 12, further including anti-tiedown circuitry characterized in that one throw of said relay is operatively connected to said anti-tiedown circuitry for each mode of machine operation.*

*16. For use in conjunction with a machine having a mode of operation and a circuit responsive to two input signals, said circuit preventing said mode of operation unless said circuit receives said input signals substantially simultaneously when an operator exerts force onto a pair of manually operable switches, a method of updating the control of said machine, comprising the steps of:*

*removing said manually operable switches while leaving said circuit intact;*

*providing a pair of housings, each having a generally U-shaped opening defined by a pair of substantially vertical side members with opposed facing surfaces extending upwardly from a bottom surface, each opening being of sufficient size to allow the introduction of at least a portion of a human hand thereinto, and an optical switch assembly disposed in each opening for producing said input signals; and*

*connecting said optical switch assemblies to said circuit.*

* * * * *